(12) United States Patent
Haddadin et al.

(10) Patent No.: US 8,401,108 B1
(45) Date of Patent: Mar. 19, 2013

(54) MODULATION AND DEMODULATION OF BAND-LIMITED SIGNALS USING NEAR-NYQUIST SAMPLING

(75) Inventors: Osama S. Haddadin, Salt Lake City, UT (US); William McIntire, Sandy, UT (US)

(73) Assignee: L-3 Communications Corp, New York, NY (US)

( * ) Notice: Subject to any disclaimer, the term of this patent is extended or adjusted under 35 U.S.C. 154(b) by 1197 days.

(21) Appl. No.: 12/209,144

(22) Filed: Sep. 11, 2008

(51) Int. Cl.
H04L 27/00 (2006.01)

(52) U.S. Cl. .......................................... 375/295

(58) Field of Classification Search ............... 375/219, 375/232, 259, 260, 261, 265, 267, 295, 316, 375/340, 343, 348; 370/208, 210, 329, 332, 370/335, 337, 344, 480

See application file for complete search history.

(56) References Cited

U.S. PATENT DOCUMENTS

| | | | | |
|---|---|---|---|---|
| 5,163,044 A | * | 11/1992 | Golden | 370/286 |
| 5,495,203 A | * | 2/1996 | Harp et al. | 329/306 |
| 5,671,257 A | * | 9/1997 | Cochran et al. | 375/355 |
| 5,978,823 A | * | 11/1999 | Koslov et al. | 708/313 |
| 6,211,924 B1 | * | 4/2001 | Patel et al. | 348/726 |
| 6,275,836 B1 | * | 8/2001 | Lu | 708/313 |
| 6,563,859 B1 | * | 5/2003 | Oishi et al. | 375/148 |
| 6,721,371 B1 | | 4/2004 | Barham et al. | |
| 7,205,859 B2 | | 4/2007 | Beadle et al. | |
| 2003/0107986 A1 | * | 6/2003 | Malkemes et al. | 370/208 |
| 2004/0184565 A1 | * | 9/2004 | Beadle et al. | 375/340 |
| 2004/0190641 A1 | * | 9/2004 | Ojard | 375/261 |
| 2005/0123032 A1 | * | 6/2005 | Chen | 375/229 |
| 2005/0220185 A1 | * | 10/2005 | Dowling | 375/232 |
| 2005/0286660 A1 | * | 12/2005 | Nysen et al. | 375/343 |
| 2007/0110184 A1 | * | 5/2007 | Liang et al. | 375/302 |
| 2007/0274419 A1 | * | 11/2007 | Lee et al. | 375/343 |
| 2009/0136238 A1 | * | 5/2009 | Gill et al. | 398/141 |

FOREIGN PATENT DOCUMENTS

| | | |
|---|---|---|
| WO | WO 98/12849 | 3/1998 |
| WO | WO 01/59980 | 8/2001 |

* cited by examiner

*Primary Examiner* — David C. Payne
*Assistant Examiner* — Syed Haider
(74) *Attorney, Agent, or Firm* — Kirton McConkie (57) ABSTRACT

Techniques for modulation and demodulation using near-Nyquist sampling operate using substantially band-limited signal. In modulating, the substantially band-limited signal is formed by filtering modulated symbol date to produce a complex sample stream having a bandwidth of less than the twice the associated symbol transmission rate and with a sample rate of less than twice the symbol rate. In demodulating, a substantially band-limited signal having a bandwidth of less than twice the associated symbol transmission rate is sampled at a sample rate of less than twice the symbol rate of the modulation.

25 Claims, 4 Drawing Sheets

MODULATION AND DEMODULATION OF BAND-LIMITED SIGNALS USING NEAR-NYQUIST SAMPLING

FIELD

The present application relates to wireless communications. More particularly, the present application relates to techniques for modulation and demodulation using digitally sampled band-limited signals.

BACKGROUND

Digital communications systems often include a modem. A modem is used for modulation and/or demodulation of digital data signals. In modulation, the digital data signal is encoded into an analog format signal (e.g., a carrier wave or radio signal), and in demodulation, the digital signal is extracted from an analog format signal. Modulation formats can include, for example, phase shift keying, amplitude shift keying, frequency shift keying, and combinations thereof.

Modems are often implemented using digital signal processing techniques which operate on digitized discrete time samples of the signals. Digital signal processing techniques can be realized in hardware, software, or a combination thereof. High data rates are often desired, which in turn translates into high processing speed requirements on the modem implementation.

Various constraints, such as Nyquist's theorem apply to the digital sampling of signals, setting limits on the sampling rates which can be used. Previously, modems have operated using sample rates in excess of two samples per symbol. Limitations in hardware processing speeds (e.g., the digital signal processing subsystem, analog to digital converters, and digital to analog converters) have set upper limits to the data rates at which modems can operate. While continuous advances in technology have allowed for continually increasing data rates, there is a desire to find more efficient techniques which allow higher data rates to be provided within existing technology constraints.

SUMMARY

Accordingly, techniques to allow processing at lower digital sample rates, for example, sampling at near-Nyquist frequencies have been developed.

In some embodiments of the invention, a method of modulating symbol data having an associated symbol transmission rate includes processing the symbol data to form a digital sample stream representing modulated symbol data. The digital sample stream can be filtered to form a substantially band-limited complex sample stream having a bandwidth of less than the twice the associated symbol transmission rate and with a sample rate of less than twice the symbol rate. The digital sample stream can be converted into an analog signal.

In some embodiments of the invention, a method of demodulating a signal having an associated symbol transmission rate can include filtering the signal to form a substantially band-limited signal having a bandwidth of less than twice the associated symbol transmission rate. The substantially band-limited signal can be converted from an analog form into a complex digital sample stream having a sample rate less than twice the associated symbol transmission rate. The digital sample stream can be processed to determine a symbol stream having the associated symbol transmission rate.

In some embodiments of the invention, a modulator is capable of converting digital data into a modulated signal having an associated symbol transmission rate. The modulator can include a bit to symbol mapper, a digital pulse-shaping filter, and a digital to analog converter. The bit to symbol mapper can convert the digital data input into symbol output which is filtered by the digital pulse-shaping filter to produce complex band-limited samples having a bandwidth less than twice the associated symbol transmission rate at a sample rate of less than two samples per symbol. The digital to analog converter can convert the band-limited samples to an analog output.

In some embodiments of the invention, a demodulator is capable of converting a modulated signal having an associated symbol transmission rate into digital data. The demodulator can include a filter, an analog to digital converter, and a matched filter. The filter can substantially band-limit an input signal to form a band-limited analog signal having a bandwidth of less than twice the associated symbol transmission rate. The analog to digital converter can complex sample the band-limited analog signal and output digital samples at a sample rate of less than two samples per symbol. The matched filter can filter the band-limited analog signal to produce symbol estimates at the associated symbol transmission rate.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

DETAILED DESCRIPTION

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In describing the present invention, the following terminology will be used:

The singular forms "a," "an," and "the" include plural referents unless the context clearly dictates otherwise. Thus, for example, reference to a filter includes reference to one or more filters.

As used herein, the term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art.

By the term "substantially" is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Numerical data may be expressed or presented herein in a range format. It is to be understood that such a range format is used merely for convenience and brevity and thus should be interpreted flexibly to include not only the numerical values explicitly recited as the limits of the range, but also as including all the individual numerical values or sub-ranges encompassed within that range as if each numerical value and sub-range is explicitly recited. As an illustration, a numerical range of "about 1 to 5" should be interpreted to include not only the explicitly recited values of about 1 to 5, but also include individual values and sub-ranges within the indicated range. Thus, included in this numerical range are individual values such as 2, 3, and 4 and sub-ranges such as 1-3, 2-4, and 3-5, etc. This same principle applies to ranges reciting only one numerical value and should apply regardless of the breadth of the range or the characteristics being described.

As used herein, a plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As discussed herein, mention is made of various digital sample streams. It is to be appreciated that, usually, a digital sample stream has an associated sample rate. While in some instances, the associated sample rate is equal to a clock rate at which digital samples are produced (e.g., in an analog to digital converter with no output buffering), in other instances, the associated sample rate can be unrelated to a clock rate used to transfer (e.g., input or output) the digital sample stream. For example, transfer of multiple digital samples can be performed in parallel, in which case the clock rate used for transfer of digital samples is typically a fraction of the sample rate associated with the digital samples. Such parallel transfer is helpful when parallel, block, or batch processing implementations are used. As another example, digital samples can be transferred in a serial format, wherein individual bits of a digital sample are sent serially across a single data line. In a serial transfer, a clock rate used for transfer of the digital sample stream can be a multiple of the sample rate associated with the digital samples.

As a specific illustration, and not by way of limitation, a sample stream at a 1 GHz sample rate can be transferred at a clock rate of 250 MHz, wherein four samples are provided in parallel. The sample stream can be input into a memory, where processing is performed on the sample stream. The processing can be performed at a processing rate unrelated to the sample rate. The processing can produce a rate change, for example, upsampling the samples to a 2 GHz sample rate by producing interpolated samples. The interpolated samples can also be stored in the memory, and thus there may be no physical clock signal corresponding to the 2 GHz sample rate. The interpolated samples can then be downsampled to a 400 MHz sample rate, again using processing performed at a processing rate unrelated to the sample rate. The 400 MHz sample rate samples can then be output from the memory, transferred in an asynchronous manner (e.g. direct memory access bursts) across an interface, while an average transfer rate is equal to the 400 MHz sample rate. This example is presented as an illustration for the purposes of explaining terminology, and it will be appreciated that many different combinations of sample rates, processing clock rates, input clock rates and output clock rates can be used in various embodiments of the present invention.

As noted above, modems typically operate at sample rates greater than or equal to two samples per symbol. This is not essential, however, as the Nyquist theorem states that digital sample rates need only equal or exceed twice the bandwidth of the signal being sampled. In many cases, when a modulated signal includes pulse shaping, the bandwidth can be less than twice the symbol rate of the modulation. Thus, sample rates of less than twice the symbol rate can be used (or, for real samples, as opposed to complex samples, sample rates of four times the symbol rate).

As a specific example, consider a root-raised cosine (RRC) filtered waveform. The one-sided bandwidth of an RRC filtered waveform is $(Rs+\alpha)/2$, where Rs is the symbol rate and a is the roll-off factor. For example, for $\alpha=0.3$, and Rs=1 GHz, the one-sided bandwidth of the modulated signal is about 0.65 GHz, and therefore the Nyquist sampling theorem states that the sample rate need be about 1.3 GHz or greater. Previously, a sample rate of about 2 GHz or 4 GHz would be used, well above the Nyquist limit. In contrast, in some embodiments of the present invention, near-Nyquist sample rates between about 1.3 GHz and about 2 GHz can be used. These lower sample rates can reduce the computational burden, or alternately, be used to allow for higher symbol rates and thus higher data rates for a given sample rate. As a particular example, a sample rate of about 1.6 GHz can be used, allowing about 20% guard band for analog anti-aliasing or reconstruction filters.

Conversely, using the previous 2 GHz sample rate, operation at data rates up to about 1.35 Gbit per second can be accommodated, in contrast to operation at about 1 GHz as previously provided.

When using complex sample rates less than two times the symbol rate, there can be a non-integer number of samples per symbol. Previously, this has been viewed as an undesirable situation due to complexity introduced into the demodulator. It has been recognized by the present inventors, however, that the non-integer ratio of samples to symbols can be accommodated using relatively low implementation complexity interpolating and decimating filters. The resulting additional computation is well justified by the increased data rates than can be obtained.

Moreover, interpolating and decimating filters can also be used to digitally implement sample timing adjustments. This is in contrast to conventional techniques which adjust the clock to the analog to digital converter in order to maintain symbol timing aligned.

Figure 1:
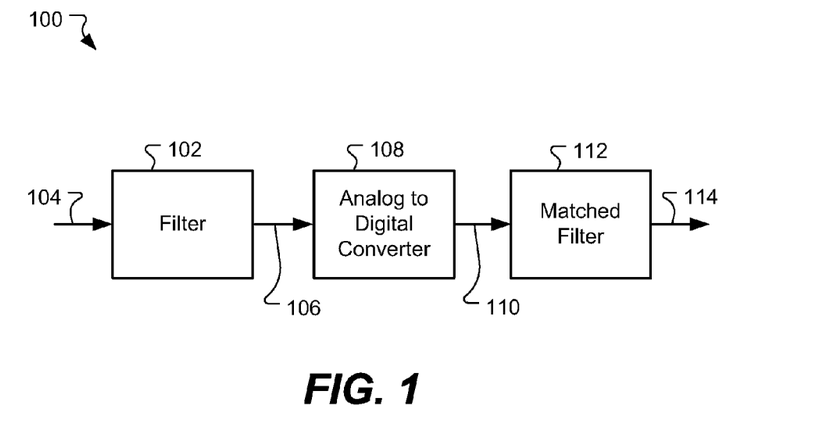
FIG. 1 is a block diagram of a demodulator in accordance with some embodiments of the present invention.

FIG. 1 illustrates a demodulator for converting a modulated signal into digital data in accordance with some embodiments of the present invention. The modulated signal has an associated symbol rate (the rate at which modulated symbols are encoded onto the signal). The modulation format can be, for example, phase shift keying, frequency shift keying, amplitude shift keying, or combinations thereof. Specific examples include binary or quadrature phase shift (BPSK or QPSK), quadrature amplitude modulation (QAM, e.g. 16-QAM or 256-QAM), and similar modulation formats as known in the art.

The demodulator 100 can include a filter 102 having an input for accepting an analog input signal 104. The filter can produce a substantially band-limited analog signal 106 output having a bandwidth of less than twice the associated symbol rate. For example, the filter can be a complex bandpass filter that filters a baseband signal in an inphase-quadrature format using substantially identical real and imaginary part low pass filters. As another example, the filter can be an intermediate frequency bandpass filter which operates in an intermediate stage of a receiver. Note that, even though the analog input signal may have been band-limited when transmitted, the filter 102 can help to eliminate noise and other adjacent signals present in the input.

It will be appreciated that analog signals can be substantially band-limited rather than exactly band-limited, in that some residual signal can pass through the stop band of the filter, and noise components can be introduced which are outside the bandwidth of the filter. Accordingly, the degree to which the filter produces a band-limited signal is application dependent, and filter rejection can be, for example, 20 dB, 30 dB, 50 dB, or other values as desired in a particular application.

The demodulator 100 can also include an analog to digital converter 108 coupled to the filter. The analog to digital converter can complex sample the band-limited analog signal and output digital samples 110. The output rate of the digital samples can be less than two samples per symbol. Accordingly, the sample rate can be referred to as being near-Nyquist, since a relatively small guard band for anti-aliasing filtering can be provided. The analog to digital converter can be, for example, a pair of analog to digital converters for sampling inphase and quadrature components of a baseband input signal. As another example, the analog to digital converter can be a single analog to digital converter which performs intermediate frequency sampling and includes associated digital processing (e.g., Hilbert transform processing, quadrature digital down conversion, and the like) to produce complex output samples.

Coupled to the analog to digital converter 108 can be a matched filter 112. The matched filter can accept the digital samples and perform processing to produce symbol estimates. For example, the matched filter can be a finite impulse response filter having a response matched to the modulation pulse shaping. The matched filter can output symbol estimates 114, which are on average formed at the associated symbol rate or other rate. The matched filter can be, for example, a complex filter, having a real part and an imaginary part. For example, the matched filter can be a root raised cosine filter, raised cosine filter, or other pulse shapes.

The input digital sample rate to the matched filter 112 and the output symbol rate need not have an integer ratio relationship. Accordingly, in some embodiments, the matched filter can include a fractional interpolator. Various ways of implementing a fractional interpolator can be used. For example, a fractional interpolator can be implemented using a cascade of an upsampling filter and a downsampling filter. Using such an approach, rational interpolating ratios can be obtained, such as ratios of N/M, wherein N and M are each integers. For large values of N and M, multiple filter sections can be used (e.g., using prime factors of N and M in the different filter sections). As a specific example, sampling can be performed at a 2 GHz rate, interpolation to 2.8 GHz performed (using a ratio of 7/5), and matched filtering of symbols at a 1.4 GHz rate performed for operation at a 1.4 GHz symbol rate.

A benefit of allowing the analog to digital converter 108 to operate at a different rate than the symbol rate is that increased flexibility is obtained in the demodulator. For example, in some embodiments, the analog to digital converter can be operated at its maximum possible rate, providing the greatest dynamic range possible. Operation at multiple differing data rates at different times can be provided in some embodiments by changing the interpolation ratio in the fractional interpolator without requiring a change in the analog to digital converter clock rate. The fractional interpolator can provide for operation at a plurality of different interpolation ratios, and can even include decimation. For example, for a 2 GHz sample rate, operation at symbol rates of 1.4 GHz, 1 GHz, 0.7 GHz, 0.5 GHz can be accommodated by sample rate changes of 14/10, 10/10, 7/10, and 5/10. Implementation can be performed using an upsampling filter which is selectable between upsampling factors of 5, 7, 10 and 14, and a fixed downsampling filter with a downsampling actor of 10. Accordingly, in some embodiments, the interpolating filter can include an upsampling filter component and a downsampling filter component, wherein one or both of the filter components operate at a variable ratio. Various other arrangements can also be used.

In accordance with some embodiments, various additional components and signal processing operations can be inserted between the analog to digital converter 108 and the matched filter 112. For example, an equalizer (not shown) can be included to help compensate for distortion introduced by the sampling and interpolating process or to remove intersymbol interference. As another example, digital receiver processing, such as a phase rotator (not shown), frequency mixer (not shown), automatic gain control amplifier (not shown), and similar elements can be included. Implementation of such elements is known in the art, and thus these need not be described further.

In accordance with some embodiments, the filter 102 can include a predistortion response to compensate for distortion or loss introduced in the analog to digital converter 108 or matched filter 112 due to the relatively low sample rate to signal bandwidth ratio.

Figure 2:
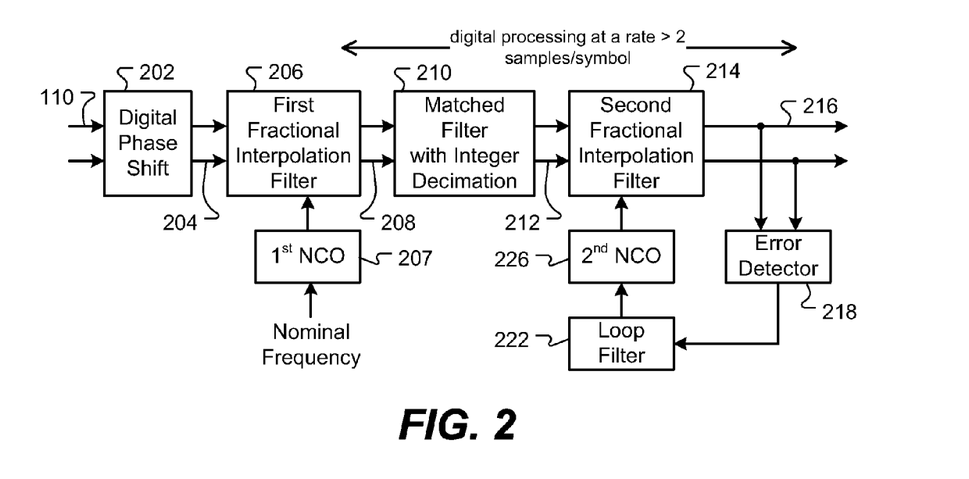
FIG. 2 is a block diagram of an alternate arrangement of portions of a demodulator in accordance with some embodiments of the present invention.

FIG. 2 provides an illustration of alternate processing components which can be used in place of or in addition to the matched filter 112 (FIG. 1) showing additional details and features according to some embodiments of the invention. Complex samples 110 from the analog to digital converter are provided to a digital phase shifter 202. Note that a real and imaginary path have been shown explicitly in FIG. 2. The digital phase shifter can provide for frequency down conversion, phase recovery, and similar functions. The digital phase shifted samples 204 are then provided to a first fractional interpolation filter 206. The first fractional interpolation filter upsamples the phase shifted samples to produce a sample stream 208 having an associated sample rate of two (or, if desired, a larger integer factor) samples per symbol. The first fractional interpolator filter can be driven by a first numerically controlled oscillator (NCO) 207 which can be used to control sample timing of the sample stream 208 to maintain synchronization to the symbol boundaries. For operation at multiple data rates, the first fractional interpolation filter can be bypassed (or set to a pass through mode) when operating at lower data rates where the input sample rate exceeds two samples per symbol.

The samples 208 are provided to a matched filter 210, which can decimate the sample stream if desired, outputting matched filtered samples 212. An error detector 218 can feed a loop filter 222 and a second NCO 226 to produce a phase tracking loop.

A second fractional interpolation filter 214 can be included, if desired, for operation when the sample rate into the matched filter is greater than two samples per symbol, allowing for decimation to two samples per symbol at the output 216. Accordingly, operation both above and below sample rates of two samples per symbol and operation at rates above one sample per symbol, but less than two samples per symbol, can be provided in some embodiments.

Figure 3:
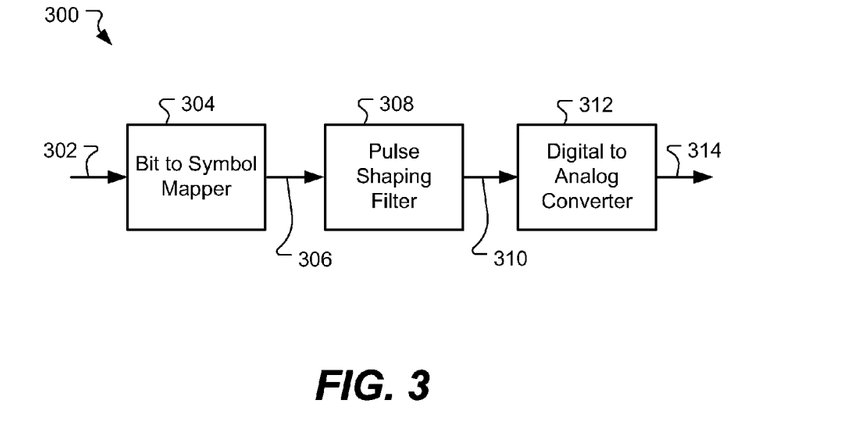
FIG. 3 is a block diagram of a modulator in accordance with some embodiments of the present invention.

Near-Nyquist sampling can also be applied to a modulator using similar techniques as described above for the demodulator. For example, FIG. 3 illustrates a modulator for converting digital data into a modulated signal in accordance with some embodiments of the present invention. The modulator 300 can accept input digital data 302. The modulator can include a bit to symbol mapper 304 which converts the digital data input into symbols 306 having an associated symbol rate. For example, as described above, various modulation formats can be used. The symbols can be provided to a pulse-shaping filter 308. The pulse-shaping filter can produce complex band-limited samples 310 having a bandwidth less than twice the associated symbol rate at a sample rate of less than two samples per symbol. The pulse-shaping filter can be, for example, a complex filter, having a real part and an imaginary part. For example, the pulse-shaping filter can be a root raised cosine filter, raised cosine filter, or other pulse shapes. The band-limited samples can be provided to digital to analog converter 312 to produce analog output 314.

Similarly to the demodulator described above, the sample rate of the symbols 306 need not have an integer relationship to the sample rate of the complex band-limited samples. Accordingly, in some embodiments, the digital pulse-shaping filter can include a fractional decimator. For example, a symbol rate of 1 GHz can be represented by a 2 GHz sample rate stream, and pulse shape filtered to produce complex band-limited samples at a rate of 1.6 GHz. In this example, decimation by a ratio of 16/20 (8/10 or 4/5) can be performed. Similarly to the demodulator described above, in some embodiments, the fractional decimator can be operable at a plurality of different decimation ratios. In some embodiments the fractional decimator can include an upsampling filter portion and a downsampling filter portion, wherein one or both of the filter portions operates at a variable ratio. For example, operation at upsampling/downsampling ratios of 4/5, 5/5, 8/5, and 10/5 can be included to allow for operation at corresponding multiple symbol rates.

Figure 4:
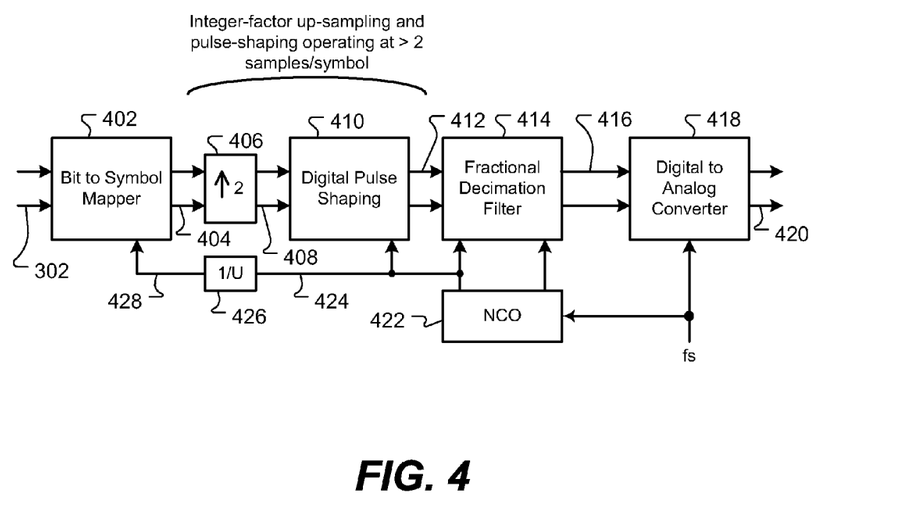
FIG. 4 is a block diagram of an alternate arrangement of a modulator in accordance with some embodiments of the present invention.

FIG. 4 provides an illustration of an alternate arrangement of a modulator showing additional details and features according to some embodiments of the invention. Input digital data 302 is provided to a bit to symbol mapper 402 which produces complex symbols 404. The complex symbols are upsampled using upsampler 406 to produce two samples per symbol 408, which are provided to the digital pulse shaping 410. The digital pulse shaping produces substantially band-limited samples 412 which can then be decimated by fractional decimation filter 414 to form a sample stream 416 having a sample rate (fs) less than two samples per symbol. The sample stream can be provided to an analog to digital converter 418 to produce analog output 420. A sample clock fs can drive the digital to analog converter and a NCO 422 to produce clocking or strobe signals 424 for the processing which is performed at two samples per symbol (upsampler, digital pulse shaping, and fractional decimation). A divider 426 can divide the clock by an upsampling ratio (U) to provide a clock 428 to drive the bit to symbol mapper.

In some embodiments, various portions of the modulator and demodulators described above can be implemented in digital hardware. Digital hardware can include, for example, discrete logic components, field programmable gate arrays (FPGAs), and application specific integrated circuits (ASICs). For example, digital phase shifters, interpolating filters, decimating filters, matched filters, pulse-shaping filters, NCO, and bit to symbol mappers can be implemented in digital hardware. As a particular example, in some embodiments, the matched filter and pulse-shaping filter can be efficiently implemented using a finite impulse response filter structure. Various implementations of finite impulse response filters are known, and need not be explained further here. As another example, in some embodiments, the bit to symbol mapper can be implemented using a look up table.

In some embodiments, various portions of the modulator and demodulator can be implemented in software for execution on a general purpose or specialized processor, such as a digital signal processor (DSP). For example, computer executable instructions can be provided on a computer readable media to cause the processor to perform a series of actions. Various computer readable media are known in the art, including for example, memory devices such as flash memory, programmable read only memory, mask-programmed read only memory, fuse-programmable memory, magnetic memory, ferro-electric memory, optical memory, and the like.

A mixture of hardware and software can be used in some embodiments. For example, the bit to symbol mapper can be implemented in a DSP, while the various filters can be implemented in an FPGA. Various combinations of digital hardware and software can be used for the different portions of the modulator and demodulator.

Figure 5:
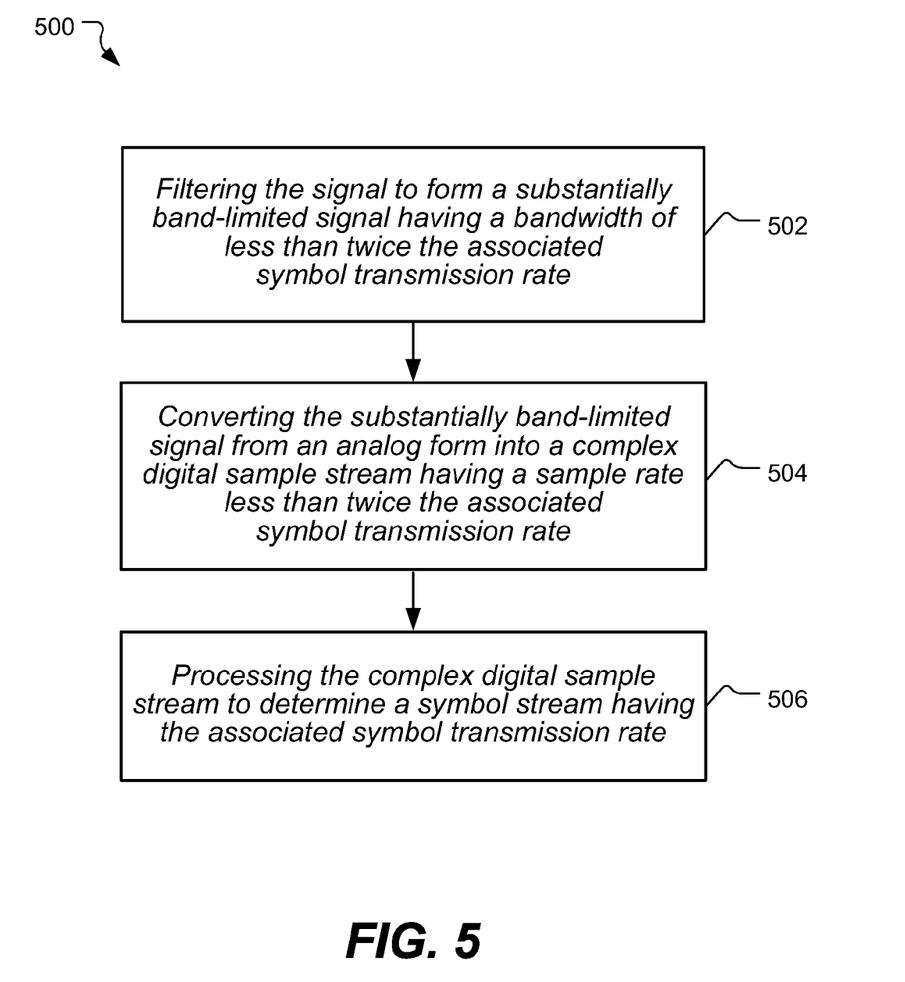
FIG. 5 is a flow chart of a method for demodulating a signal in accordance with some embodiments of the present invention.

In accordance with some embodiments of the present invention, a method of demodulating a signal is illustrated in flow chart form in FIG. 5. The method 500 can include filtering 502 the signal to form a substantially band-limited signal. For example, the filtering can be performed by a complex baseband filter or intermediate frequency filter as described above. The band-limited signal can have a bandwidth of less than twice a symbol rate associated with the signal.

Another operation of the method 500 can be converting 304 the substantially band-limited signal from an analog form into a complex digital sample stream having a real part and an imaginary part. The complex digital sample stream can have a sample rate of less than twice the symbol rate. The converting can be performed by an analog to digital converter, for example as described above.

The method 500 can also include processing the complex digital sample stream to determine a symbol stream having the associated symbol transmission rate. The digital sample stream can be output, for example to other processing elements (e.g., digital hardware or processors). Processing the digital sample stream can be performed by a matched filter, for example, as described above. The matched filter can be matched to various pulse shapes.

Processing the digital sample stream can include interpolating the digital sample stream to change the sample rate using a fractional interpolation ratio. For example, the interpolating can be by a factor of M/N, wherein N and M are positive integers. M can be greater than N.

Figure 6:
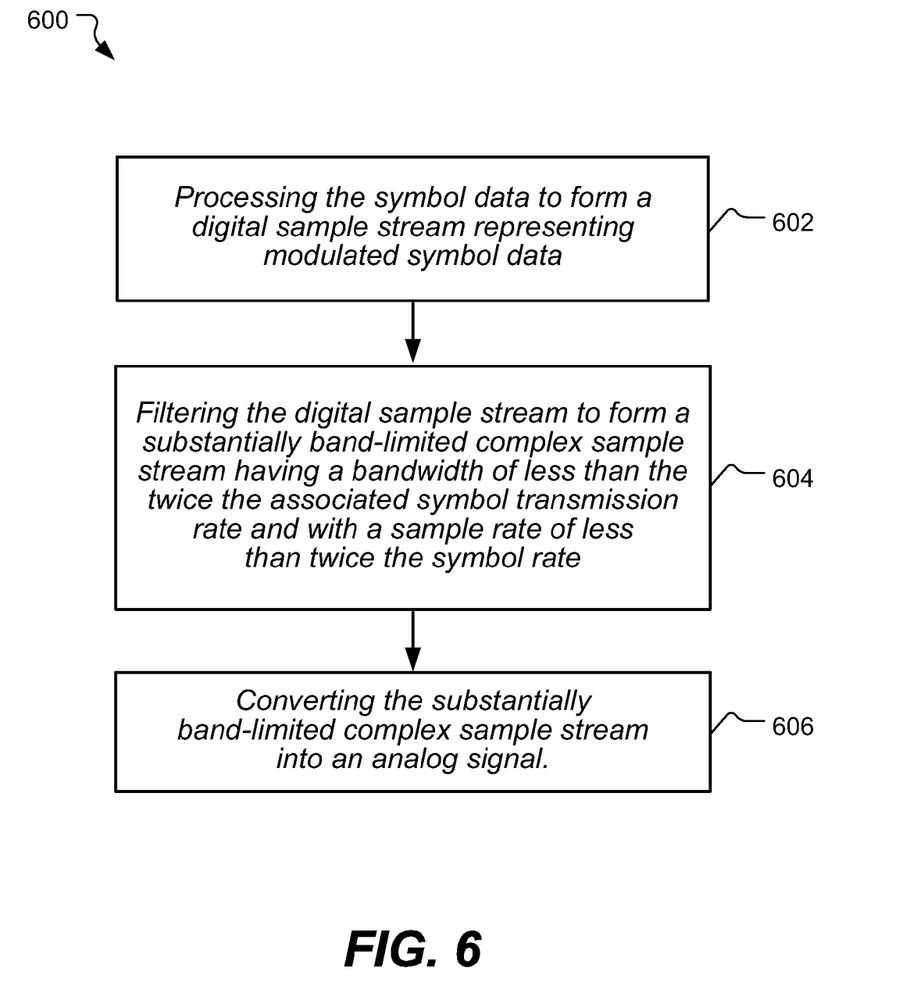
FIG. 6 is a flow chart of a method for modulating a signal in accordance with some embodiments of the present invention.

In accordance with some embodiments of the present invention, a method of modulating a signal is illustrated in flow chart form in FIG. 6. The method 600 can include processing 602 the symbol data to form a digital sample stream representing modulated symbol data. The symbol data can have an associated symbol rate. The processing can be performed by a bit to symbol mapper, for example, as described above.

Another operation of the method 600 can be filtering 604 the digital sample stream to form a substantially band-limited complex sample stream having a real part and an imaginary part. The complex sample stream can have a sample rate of less than twice the symbol rate. The filtering can include decimating the digital sample stream using a fractional decimation ratio, for example as described above. As a particular example, processing the symbol data can produce modulated symbol data at a sample rate equal to N times the symbol rate, and filtering the digital sample stream can decimate the digital sample stream by a rate of M/N, wherein M and N are positive integers. N can be greater than M.

The method 600 can also include converting 606 the substantially band-limited complex sample stream into an analog signal. The converting can be performed by a digital to analog converter, for example as described above. The analog signal can be transmitted via a wireless channel.

Summarizing and reiterating to some extent, a technique for modulating and demodulating symbol data using reduced sample rates has been developed. The technique takes advantage of band limiting associated with pulse shaping. The technique is highly flexible, in that non-integer ratios of the sample rate and symbol rate can be accommodated. Very high data rates can thus be accommodate by using sampling rates between one complex sample per symbol and two complex samples per symbol. In contrast, conventional band-pass sampling has used rates greater than twice the symbol rate, and, typically rates of four times the symbol rate in order to maintain an integer relationship While a number of illustrative applications have been illustrated, many other applications of the presently disclosed techniques may prove useful. Accordingly, the above-referenced arrangements are illustrative of some applications for the principles of the present invention. It will be apparent to those of ordinary skill in the art that numerous modifications can be made without departing from the principles and concepts of the invention as set forth in the claims.

The invention claimed is:

1. A method of modulating symbol data, the method comprising:
   processing unmodulated digital symbol data to form a stream of modulated digital symbol data having a symbol rate;
   filtering the stream of modulated digital symbol data to form a substantially band-limited complex sample stream having a bandwidth of less than twice the symbol rate and with a sample rate of less than twice the symbol rate; and
   converting the substantially band-limited complex sample stream into an analog signal,
   wherein the processing the unmodulated digital symbol data produces the stream of modulated digital symbol data at a sample rate equal to N times the symbol rate of the stream of modulated digital symbol data, wherein N is a positive integer, and
   the filtering the stream of modulated digital symbol data comprises decimating the stream of modulated digital symbol data by a rate of M/N, wherein M is a positive integer, M is not equal to N, and the rate of M/N is a non-integer value.

2. The method of claim 1, further comprising transmitting the analog signal via a wireless channel.

3. The method of claim 1, wherein the stream of modulated digital symbol data comprises a real part and an imaginary part.

4. A method of demodulating an analog signal having an associated symbol transmission rate, the method comprising:
   filtering the analog signal to form a substantially band-limited signal in analog form having a bandwidth of less than twice the associated symbol transmission rate of the analog signal;
   converting, with an analog to digital converter sampling at a sample rate that is less than twice the associated symbol transmission rate of the analog signal, the substantially band-limited signal from the analog form into a complex digital sample stream;
   processing the complex digital sample stream to determine and output a symbol stream having the associated symbol transmission rate of the analog signal,
   wherein the processing the complex digital sample stream comprises:
   up-sampling the complex digital sample stream to have a sampling rate that is greater than two samples per symbol, wherein the up sampling produces an up sampled complex digital sample stream, and
   performing matched filtering on the up-sampled complex digital sample stream and thereby producing a matched filtered up-sampled complex digital sample stream.

5. The method of claim 4, wherein the up-sampling the complex digital sample stream comprises interpolating the digital sample stream using a non-integer fractional interpolation ratio.

6. The method of claim 4, wherein the processing the complex digital sample stream further comprises down-sampling the matched filter up-sampled complex digital sample stream to two samples per symbol.

7. The method of claim 4, further comprising equalizing the digital sample stream.

8. The method of claim 4, further comprising outputting the symbol stream.

9. The method of claim 4, wherein the digital sample stream comprises a real part and an imaginary part.

10. The method of claim 4, wherein the sample rate is greater than the symbol transmission rate.

11. A modulator for converting digital data into a modulated signal having an associated symbol transmission rate, comprising:
    a bit to symbol mapper configured to convert the digital data input into symbol output at a sample rate equal to N times a symbol rate of the symbol output, wherein N is a positive integer;
    a digital pulse-shaping filter coupled to the bit to symbol mapper and configured to filter the symbol output to produce complex band-limited samples having a bandwidth less than twice the associated symbol transmission rate at a sample rate of less than two samples per symbol, wherein the digital pulse-shaping filter is configured to decimate the symbol output by a rate of M/N, wherein M is a positive integer, M is not equal to N, and the rate of M/N is a non-integer value;
    a digital to analog converter coupled to the digital pulse-shaping filter and configured to convert the complex band-limited samples to an analog output.

12. The modulator of claim 11, wherein the digital pulse-shaping filter comprises a real filter and an imaginary filter.

13. The modulator of claim 11, wherein the digital pulse-shaping filter comprises a root raised cosine filter.

14. The modulator of claim 11, wherein the bit to symbol mapper and the digital pulse-shaping filter are implemented in a field programmable gate array.

15. The modulator of claim 11, wherein the sample rate is greater than the symbol transmission rate.

16. A demodulator comprising:
    a filter configured to substantially band-limit an analog input signal to form a band-limited signal in analog form having a bandwidth of less than twice an associated symbol transmission rate of the analog signal;

an analog to digital converter coupled to the filter and configured to complex sample at a sample rate that is less than twice the associated symbol transmission rate of the analog input signal the band-limited signal in the analog form and output digital samples of the band-limited signal; and a matched filter coupled to the analog to digital converter and configured to filter the digital samples output by the analog to digital converter to produce and output at the associated symbol transmission rate of the analog input signal symbol estimates of the digital samples, wherein the matched filter is configured to filter the digital samples output by the analog to digital converter by at least:

up-sampling the digital samples output by the analog to digital converter to have a sampling rate that is greater than two samples per symbol, and performing matched filtering on the up-sampled digital samples.

17. The demodulator of claim 16, wherein the matched filter comprises a non-integer fractional interpolator.

18. The demodulator of claim 17, wherein the fractional interpolator is operable at a plurality of different interpolation ratios.

19. The demodulator of claim 16, wherein the matched filter comprises a root raised cosine filter.

20. The demodulator of claim 16, further comprising an equalizer disposed between the analog to digital converter and the matched filter.

21. The demodulator of claim 16, wherein the matched filter comprises a real part and an imaginary part.

22. The demodulator of claim 16, wherein the matched filter is implemented in a field programmable gate array.

23. The demodulator of claim 16, wherein the sample rate is greater than the symbol transmission rate.

24. The method of claim 4, wherein the processing the complex digital sample stream further comprises, after the performing matched filtering, down-sampling the matched filtered up-sampled complex digital sample stream to have the associated symbol transmission rate of the analog signal.

25. The method of claim 4, wherein the processing complex digital sample stream further comprises, prior to the up-sampling the complex digital sample stream, phase shifting the complex digital sample stream.

* * * * *